(12) United States Patent
Haruna et al.

(10) Patent No.: US 9,888,619 B2
(45) Date of Patent: Feb. 6, 2018

(54) SHIELD FILM AND SHIELD PRINTED WIRING BOARD

(71) Applicant: TATSUTA ELECTRIC WIRE & CABLE CO., LTD., Higashiosaka-shi, Osaka (JP)

(72) Inventors: Yusuke Haruna, Higashiosaka (JP); Sirou Yamauchi, Higashiosaka (JP); Hiroshi Tajima, Higashiosaka (JP); Kenji Kamino, Higashiosaka (JP)

(73) Assignee: TATSUTA ELECTRIC WIRE & CABLE CO., LTD, Higashiosaka-shi, Osaka (JP)

( * ) Notice: Subject to any disclaimer, the term of this patent is extended or adjusted under 35 U.S.C. 154(b) by 16 days.

(21) Appl. No.: 14/414,514

(22) PCT Filed: Jun. 5, 2013

(86) PCT No.: PCT/JP2013/065616
§ 371 (c)(1),
(2) Date: May 11, 2015

(87) PCT Pub. No.: WO2014/010342
PCT Pub. Date: Jan. 16, 2014

(65) Prior Publication Data
US 2015/0250080 A1    Sep. 3, 2015

(30) Foreign Application Priority Data
Jul. 13, 2012    (JP) .................................. 2012-157785

(51) Int. Cl.
*H05K 9/00*    (2006.01)
*H05K 1/02*    (2006.01)
(Continued)

(52) U.S. Cl.
CPC ............. *H05K 9/0088* (2013.01); *B32B 7/12* (2013.01); *B32B 15/04* (2013.01); *B32B 15/20* (2013.01);
(Continued)

(58) Field of Classification Search
CPC ..................... H05K 9/0039; H05K 2201/0715
See application file for complete search history.

(56) References Cited

U.S. PATENT DOCUMENTS

2006/0197176 A1    9/2006    Yang
2013/0056258 A1*   3/2013    Zhang ................... C09J 7/0292
                                                              174/388

FOREIGN PATENT DOCUMENTS

JP        63-173389 A        7/1988
JP        H06283574          10/1994
(Continued)

OTHER PUBLICATIONS

Machine translation for JP 2007294918, translation dated Jun. 2, 2016, 6 pages.*

(Continued)

*Primary Examiner* — Hung V Ngo
(74) *Attorney, Agent, or Firm* — Potomac Law Group, PLLC; Kenneth Fagin

(57) ABSTRACT

Provided are: a shield film having excellent shield characteristics in the high frequency region of the shield film; and a shield printed wiring board. A shield film (1) is provided on a flexible printed wiring board (8), which has a base film (5) having a signal circuit (6a) formed thereon, and an insulating film (7) that is provided on the whole upper surface of the base film (5) such that the insulating film covers the signal circuit (6a). The shield film 1 has an electroconductive adhesive layer 15 provided throughout a surface of the insulating film 7, and a metal layer 11
(Continued)

provided throughout a surface of the electroconductive adhesive layer 15.

16 Claims, 9 Drawing Sheets

(51) Int. Cl.
*B32B 7/12* (2006.01)
*B32B 15/04* (2006.01)
*B32B 15/20* (2006.01)

(52) U.S. Cl.
CPC ......... *H05K 1/0215* (2013.01); *H05K 1/0216* (2013.01); *H05K 1/0218* (2013.01); *H05K 1/0296* (2013.01); *B32B 2307/202* (2013.01); *B32B 2307/206* (2013.01); *B32B 2457/00* (2013.01); *H05K 2201/0154* (2013.01); *H05K 2201/0338* (2013.01); *H05K 2201/0347* (2013.01); *H05K 2201/0355* (2013.01); *H05K 2201/0707* (2013.01); *H05K 2201/0715* (2013.01); *H05K 2203/072* (2013.01); *H05K 2203/0723* (2013.01)

(56) References Cited

FOREIGN PATENT DOCUMENTS

| | | |
|---|---|---|
| JP | H0711477 A | 1/1995 |
| JP | H08125380 A | 5/1996 |
| JP | H 11055014 | 2/1999 |
| JP | 2003-086907 A | 3/2003 |
| JP | 2003086907 A | 3/2003 |
| JP | 2006007589 A | 1/2006 |
| JP | 2006245530 A | 9/2006 |
| JP | 2007-294918 A | 11/2007 |
| JP | 2008-120081 A | 5/2008 |
| JP | 2011-066329 A | 3/2011 |
| JP | 4883432 B2 | 2/2012 |
| WO | WO 2007/032087 | 3/2007 |
| WO | WO 2011/121801 A1 | 6/2011 |
| WO | WO 2012/008260 | 1/2012 |
| WO | WO 2014/010341 A1 | 1/2014 |

OTHER PUBLICATIONS

ISR from corresp. PCT app.
JP Office Action.
IPRP.
Written Opinion.
Notification of Filing of Documents in corresponding JP Application 2012-157785.
Publication 1: EMC-Related Product List, 2006 edition (Extract) (Published by: Kagakujoho Shuppan Co.Ltd., Accession Date of National Diet Library: Mar. 8, 2006).
Publication 2: All about Coating (Extract) (Published by: Converting Technical Institute, Publication Date: Dec. 3, 1999).
Third-party Submission of Information in connection with corresponding Japanese priority application 2012-157785 (translation only), citing and relying on above two references.
Office Action dated Sep. 29, 2015, issued in connection with corresponding JP Application 2012-157785.
Office Action dated May 24, 2016 issued in connection with corresponding Japanese patent application 2012-157785.
Reconsideration Report issued Oct. 13, 2016 issued in connection with corresponding Japanese patent application 2012-157785.
Office Action dated Aug. 1, 2017 in corresponding Japanese Patent Application No. 2012-157785.
Office Action dated Sep. 25, 2017 in corresponding Taiwanese Patent Application No. 10620982620.

* cited by examiner

FIG. 5
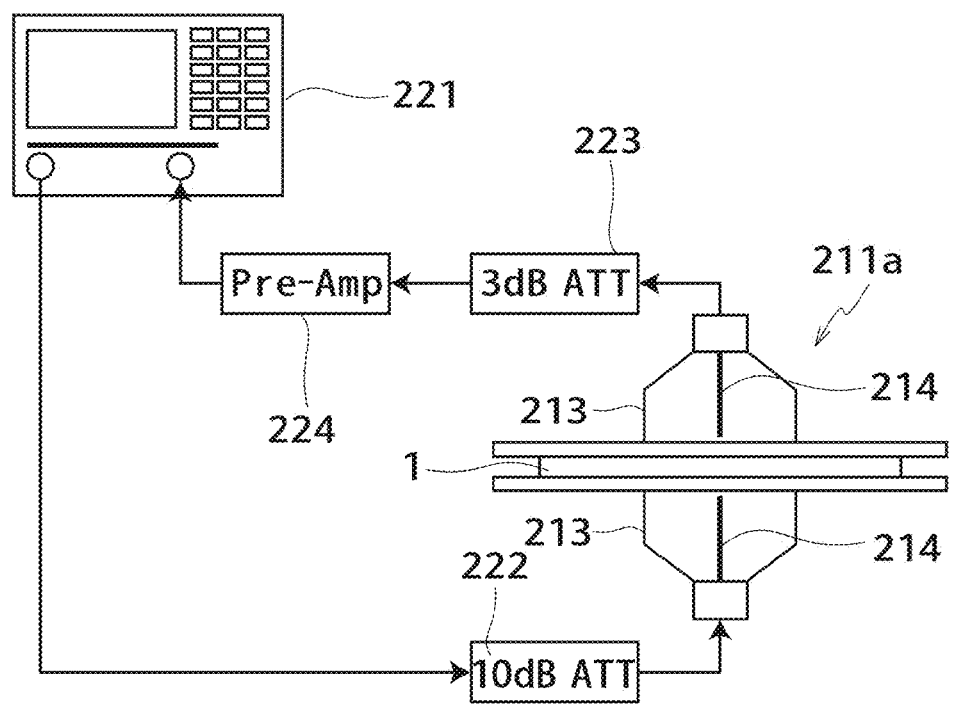
(a)
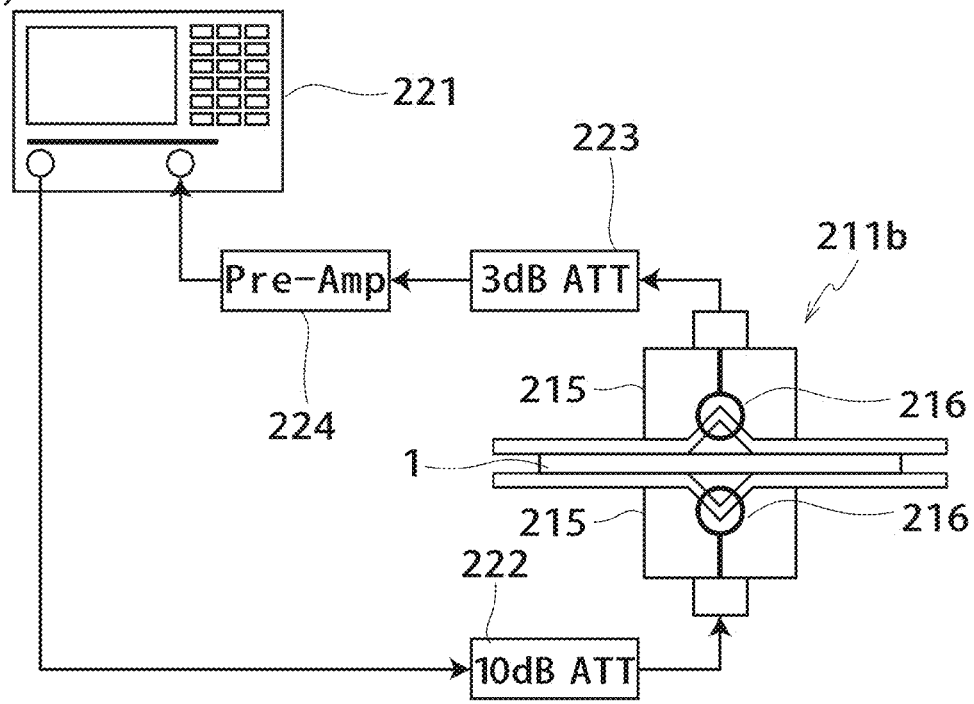
(b)

FIG. 8
(a)
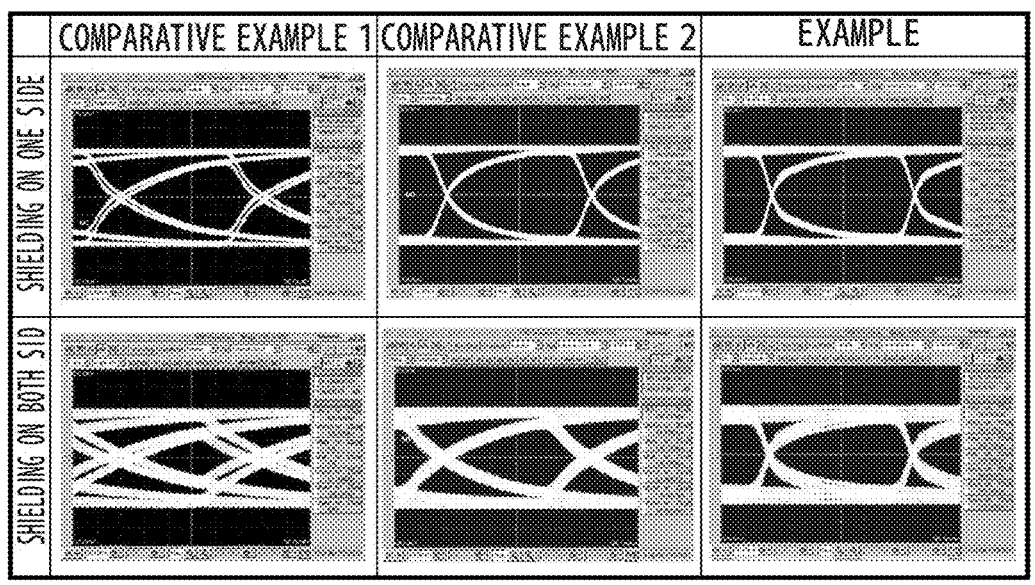
(b)
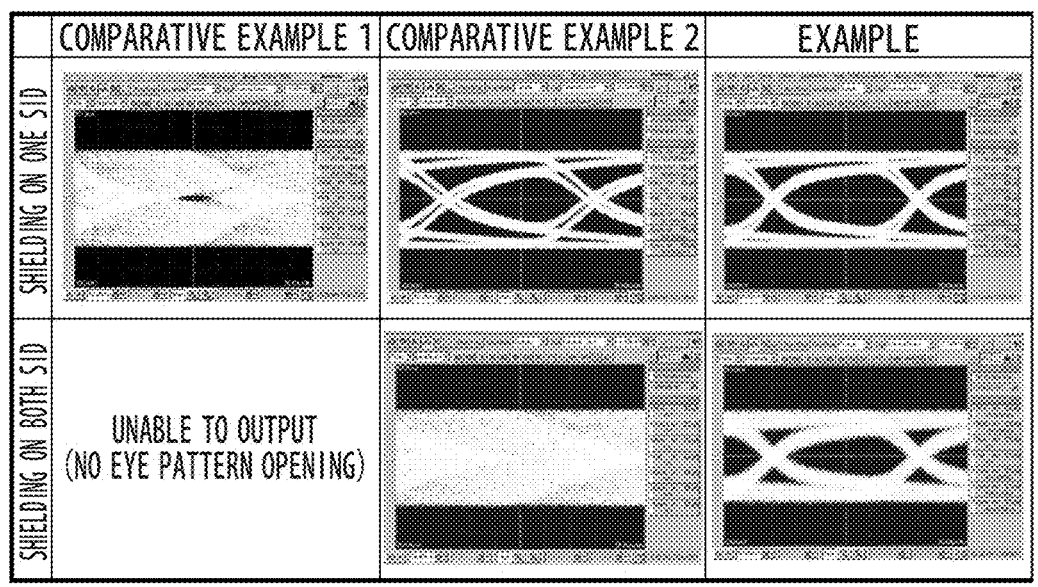

SHIELD FILM AND SHIELD PRINTED WIRING BOARD

TECHNICAL FIELD

The present invention relates to a shield film used in portable devices, personal computers, earphone jacks, and camera modules, and to a shield printed wiring board.

BACKGROUND ART

Traditionally, shield films have been used mainly in printed wiring boards for the purpose of restraining noise and/or shielding electromagnetic waves to the outside.

For example, PTL 1 discloses a shield flexible printed wiring board having a shield film covering at least one side of a substrate film including a printed circuit board and an insulating film sequentially provided on a base film, wherein the shield film is a film having a shield layer including at least an electroconductive adhesive layer on one side of a cover film, wherein the electroconductive adhesive layer covers the substrate film in such a manner that the electroconductive adhesive layer is adhered to the substrate film, and wherein the shield flexible printed wiring board is provided with a ground member having apart to be connected to the shield layer of the shield film and a part exposed and formed to be connectable to a nearby ground part.

As described, a shield film in general is capable of effectively exerting its electromagnetic wave shielding function, by stacking a ground member to the shield layer of the printed wiring board and providing connection to the ground outside.

CITATION LIST

Patent Literature

[PTL 1] Japanese Unexamined Patent Publication No. 086907/2003 (Tokukai 2003-086907)

SUMMARY OF THE INVENTION

Technical Problems

In recent years, there are increasing demands for smaller and thinner shield flexible printed wiring board due to downsizing of portable devices, personal computers, earphone jacks, and camera modules. On the other hand, while a mass volume signal processing (acceleration of signal processing) for addressing the requirement of high-speed communications is realized, there is a demand for improvement in the electromagnetic wave shielding performance.

However, in the case of PTL 1, the surface of the shield film is opened to expose the shield layer, and the ground member is adhered to the shield layer and earthed to a nearby ground part. This may cause deterioration of the shielding performance in the open part, and for this reason, restricting arrangement of the signal lines of the printed wiring board in the open part. For this reason, wiring of the printed wiring board is restricted by the connection of the shield film to the ground part.

Although PTL 1 describes a method which the ground member is buried in the shield film, the ground member needs to be arranged so as to stick out from the side part of the shield film and be uncovered, which causes a problem that the shape of portable devices, to which the shield film applied, is limited.

This further causes difficulties in installing the ground member if the shield printed wiring board is downsized.

Further, the need for stacking the ground member to the shield layer causes a problem for reduction of the thickness.

In view of the above problem, it is an object of the present invention to provide smaller and thinner shield films having electromagnetic wave shielding effect and allowing ground connection from any position outside, and shield printed wiring boards with the shield films.

Technical Solution

A shield film of the present invention is a shield film to be provided to a printed wiring board having a base member on which a wiring pattern for signals is formed and an insulating film to be provided throughout a surface of the base member so as to cover the wiring pattern for signals, including: an electroconductive adhesive layer provided throughout a surface of the insulating film; and a metal layer provided throughout a surface of the electroconductive adhesive layer.

In shield film with the structure, the metal layer is provided throughout a surface of the electroconductive adhesive layer covering the printed wiring board, and connection to an external ground is possible from any position of the metal layer. As the result, it is possible to connect the metal layer to the external ground, and the metal layer is able to effectively exert its electromagnetic wave shielding function, without providing a common ground member for the shield film. Further, since there is no need for stacking a ground member, reduction of the thickness is possible, and since the wiring pattern on the printed wiring board is not limited by the ground member, downsizing is possible.

In the shield film of the present invention, the metal layer may use metal foil whose main component is copper.

The above structure allows favorable workability and electroconductivity as well as low cost for production of such a shield film.

In the shield film of the present invention, the metal layer may be machined so that its layer thickness is from 2 μm to 12 μm.

The above structure allows favorable shielding characteristics.

In the shield film of the present invention, the metal layer may be rustproofed.

The above structure restrains deterioration of the surface of the metal layer while maintaining electroconductivity.

The shield film of the present invention may further include a plated layer provided throughout a surface of the metal layer. The above structure restrains deterioration of the surface of the metal layer caused by operating environments, and stabilizes electrical properties such as resistance value for a long period of time. Thus, a stable electromagnetic wave shielding effect is achieved.

In the shield film of the present invention, the plated layer may include at least one layer made of soft nickel.

The above structure achieves favorable deformation properties.

In the shield film of the present invention, the plated layer may include at least one layer made of soft gold plating.

The above structure achieves favorable deformation properties.

In the shield film of the present invention, the plated layer may include at least one layer which its surface is formed black.

In general, Shield films pasted on printed wiring boards are black. With the above structure, it is possible to follow the traditional exterior appearance, even in the case that the shield film of the present invention is pasted on.

In the shield film of the present invention, a minimum width may be 10 mm or less.

According to the above structure, ground connection is achieved and a printed wiring board with favorable shielding characteristics is provided even with the minimum width of 10 mm or less.

Further, in a printed wiring board to which the shield film of the present invention is provided, a wiring pattern for ground is formed on the base member, and the insulating film leaves at least apart of the wiring pattern for ground uncovered, and the electroconductive adhesive layer is electrically connected with the uncover part of the wiring pattern for ground.

In the above structure, the metal layer connectable to a ground member also becomes connectable to a wiring pattern for ground on the printed wiring board. Thus, the electromagnetic wave shielding characteristics of the metal layer is further improved.

Further, a shield printed wiring board of the present invention may include the above described printed wiring board and the shield film provided to the printed wiring board.

BRIEF DESCRIPTION OF THE DRAWINGS

FIG. 5A is a diagram showing the configuration of the system used in the KEC method. Specifically, FIG. 5A is a diagram showing a device for evaluating an electromagnetic wave shielding effect.

FIG. 5B is a diagram showing the configuration of the system used in the KEC method. Specifically, FIG. 5B is a diagram showing a device for an evaluating magnetic wave shielding effect.

FIG. 8A is a diagram showing measurement results of output waveform characteristics, with a bit rate of 1.0 Gbps.

FIG. 8B is a diagram showing measurement results of output waveform characteristics, with a bit rate of 3.0 Gbps.

PREFERRED MODE OF INVENTION

The following describes a preferable embodiment of the present invention, with reference to attached drawings.

(Structure of Shield Film 1)

Figure 1:
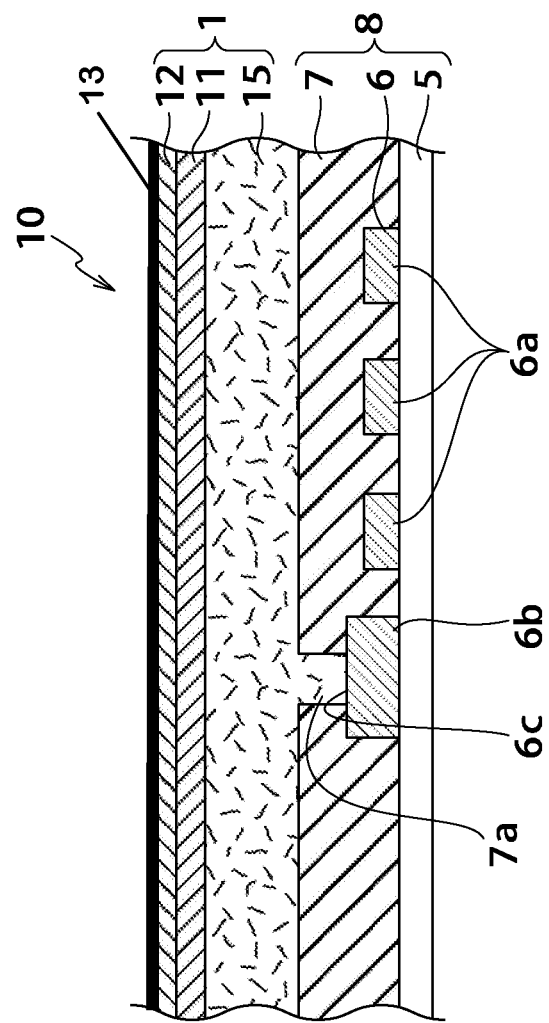
FIG. 1 is a schematic diagram showing a cross section of a shield printed wiring board provided with a shield film.

As shown in FIG. 1, a shield film 1 is provided to a flexible printed wiring board 8 (printed wiring board) that has a base film 5 (base unit) having a signal circuit 6a (wiring pattern for signals), and an insulating film 7 provided throughout a surface of the entire base film 5 so as to cover the signal circuit 6a. The shield film 1 has an electroconductive adhesive layer 15 provided throughout a surface of the insulating film 7, and a metal layer 11 provided throughout a surface of the electroconductive adhesive layer 15.

Figure 10:
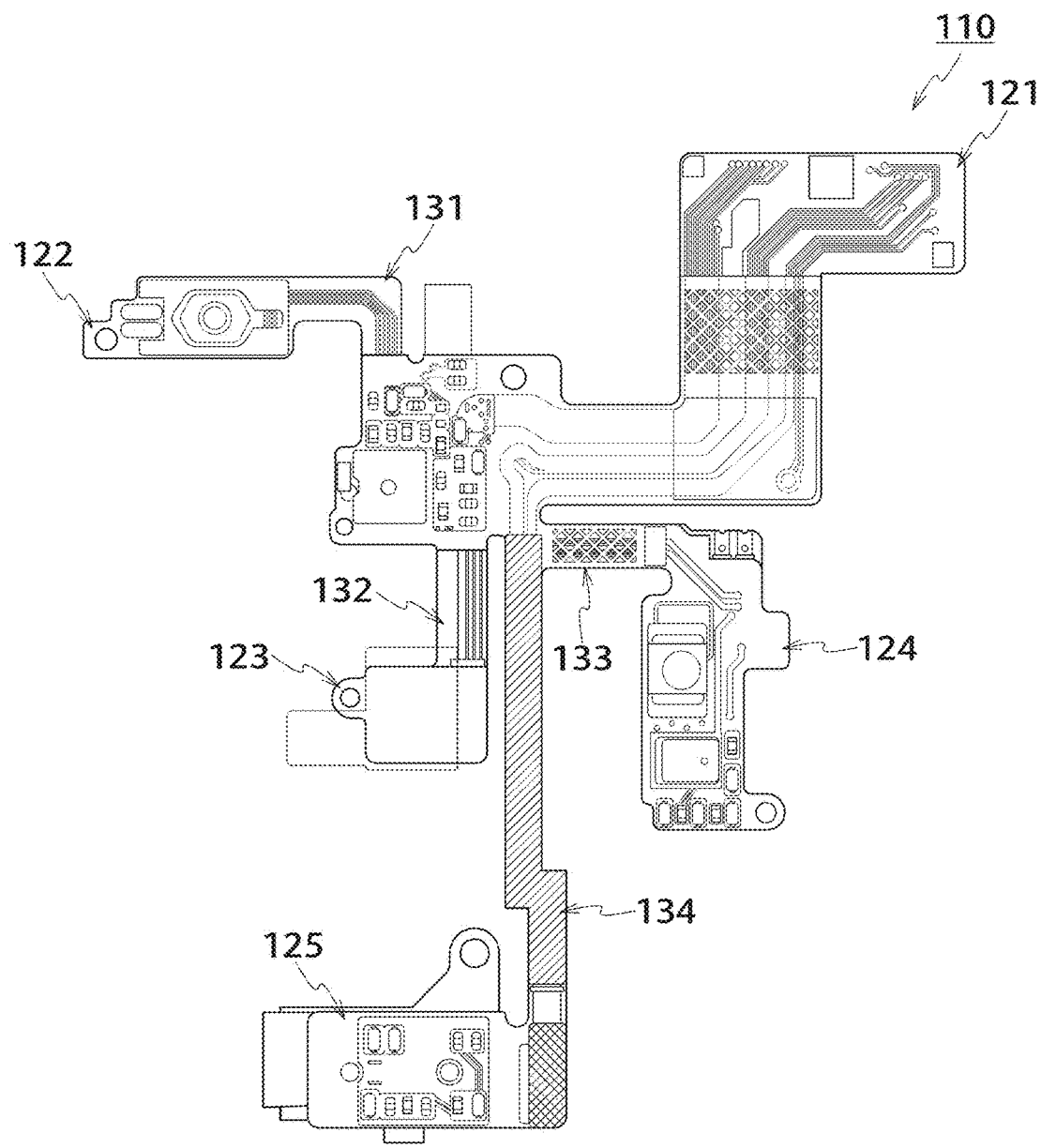
FIG. 10 is a top view showing an example shield film.

It should be noted that the shape of the shield film 1 relative to the surface directions is not particularly limited. FIG. 10 is a top view of an example shield printed wiring board provided with a shield film. The shield printed wiring board 110 may have a complicated shape as shown in FIG. 10. Specifically, the shield printed wiring board 110 includes a plurality of block units 120 (block units 121, 122, 123, 124, and 125) and connection units 130 (connection units 131, 132, 133, and 134), and a shield film is pasted to a part requiring shielding of electromagnetic waves.

In the shield printed wiring board 110 with the above-described structure, each block unit 120 is connected by the connection unit 130 having a thinner and longer shape than the block unit 120. Further, each of the block unit 120 is provided with various electronic components connected to the wiring pattern, and each electronic components is electrically connected to one another through the wiring pattern formed on the connection unit 130.

Further, in the shield printed wiring board 110, each connection unit 130 is bent and three-dimensionally accommodated in a casing, while being fixed to the casing and the like by using a screw and the like which is screwed through a through hole formed on the block unit 120.

As described, the shield printed wiring board 110 has a region with a width as narrow as the connection unit 130. Although ground connection is necessary for the narrow part in the shield film, the shield film of the present embodiment enables connection to an external ground at any position of the connection unit 130, even in case where a minimum width of the connection unit 130 is not more than 10 mm. This is because a metal layer is provided throughout the surface of the electroconductive adhesive layer covering the printed wiring board.

It should be noted that the shape of the shield printed wiring board (shield film) is not limited to the shape formed according to the connection between the above described block units and connection units. For example, the shield printed wiring board may have a polygonal shape, a circular shape, or an ellipsoidal shape, said shapes including concavo-convex and said shapes including through hole, or said shape including protrusions used to form a through hole and so on. Further, the minimum width may be not more than 10 mm, as described above.

Next, the following describes each layer shown in FIG. 1.

(Metal Layer 11)

The metal layer 11 of the embodiment is made of a metal foil whose main component is copper. That is, the metal layer 11 has a plated layer 12 on its outermost surface.

Besides, the metal layer is not limited to such configuration. For example, the metal layer may be two or more layers.

The metal layer 11 is preferably formed by rolling so that the shield film could achieve a favorable shape retention property. This way, the workability at the time of assembling flexible substrates and the like having shield film pasted thereon is improved. For example, when a flexible printed wiring board having the shield film is bent to be assembled to a portable device and the like, the favorable shape retention property of the shield film allows the flexible printed wiring board to maintain the bent state. Therefore, a worker does not have to retain the bent state of the flexible printed wiring board. Thus, there is no need for workers to maintain bent state so that the burden of assembling the portable device and the like is reduced, which brings about an improved workability. Further, in the case where the metal layer 11 is formed by rolling, the layer thickness of the metal layer 11 is preferably adjusted by etching.

The metal material for forming the metal layer 11 preferably contains copper as the main component. This realizes a favorable electroconductivity as well as low cost for production of the shield film. Furthermore, the main component of metal layer 11 is not limited to copper. It may contain any one of the nickel, copper, silver, tin, gold, palladium, aluminum, chrome, titanium, and zinc, or an alloy containing two or more of such materials.

Note that the metal layer 11 does not necessarily have to be metal foil formed by rolling, and may be a metal layer formed by a special electroplating method so as to have a structure in which crystals are spread in a surface direction as in the case of the metal foil. Doing so will also bring about a favorable shape retention property as the metal foil formed by rolling.

Note further that the lower limit of the thickness of the metal layer 11 is preferably 2 μm, and more preferably 6 μm. Further, the upper limit of the thickness of the metal layer 11 is preferably 18 μm, and more preferably 12 μm.

It should be noted that the surface of the metal layer 11 is preferably subjected to a rustproofing treatment, if the metal layer 11 has no plated layer. Water-soluble material is suitable as an antirust agent. As a main component, a benzotriazole compound or an imidazole compound is preferable. Specifically, Tough Ace® series produced by Shikoku Chemicals Corporation may be adopted, and a coating film of 0.2 to 0.3 μm is formed on the copper surface.
(Plated Layer 12)

Plated layer 12 is provided throughout a surface of the metal layer 11. For example, the plated layer 12 is formed by an electroplating method, an electroless plating method, and the like. With the formation of plated layer 12 on the outermost surface, the surface of the metal layer 11 is kept from being deteriorated while maintaining its electroconductivity. Examples of the metal material for the plated layer 12 include: gold, nickel, copper, silver, tin, palladium, aluminum, chrome, titanium, zinc, and an alloy including any one or more of such materials.

Note that the lower limit of the thickness of the plated layer 12 is preferably 0.1 μm, and more preferably 0.3 μm. Further, the upper limit of the thickness of the plated layer 12 is preferably 5 μm, and more preferably 3 μm.

In the case where nickel is adopted as the metal material for the plated layer 12, soft nickel is preferably chosen. It should be noted that soft nickel indicates nickel plating using Sulphamic acid as the plating bath. Soft nickel is lower in its electrodeposition stress as compared to cases where Watts bath is used for formation, and therefore allows reduction of internal stress. Therefore, a favorable deformation properties such as high resistance against bending and the like are achievable. Further, when gold is adopted as the metal material for the plated layer 12, soft gold of 99.99% or higher purity is preferably chosen. Accordingly, favorable deformation properties are achievable. Moreover, at least the surface of the plated layer is preferably formed in black color, as the color of shield films in general is black. For example, a nickel-tin alloy plating and the like may be conducted to form the plated layer 12 into a black plated layer. Alternatively, a black electroconductive adhesive layer 13 may be formed to the surface of the plating.

In the embodiment, the plated layer 12 is a layer formed by forming a soft gold layer through gold plating treatment after a soft nickel layer is formed through nickel plating treatment on the metal layer 11. That is, the plated layer 12 may include two layers but not limited to such configuration. For example, the plated layer may be a single layer or may include three or more layers. In short, plating process is conducted at least once.
(Electroconductive Adhesive Layer 15)

In terms of transmission properties and costs, the electroconductive adhesive layer 15 is preferably an anisotropic electroconductive adhesive layer, having anisotropic electroconductivity which maintains electric conductive state only in the thickness direction, but not limited to this. For example, the electroconductive adhesive layer 15 may be an isotropic electroconductive adhesive layer having isotropic electroconductivity which maintains electric conductive state in three dimensions consist of the thickness, width, and longitudinal directions. The electroconductive adhesive layer 15 is formed by adding flame retardant and conductive filler to the adhesive agent.

When the shield film 1 is applied to an FPC (flexible printed wiring board), the lower limit of the thickness of the electroconductive adhesive layer 15 is preferably 2 μm, and more preferably 3 μm. Further, the upper limit of the thickness of the electroconductive adhesive layer 15 is preferably 15 μm, and more preferably 9 μm.

The adhesive agent included in the electroconductive adhesive layer 15, as an adhesive resin, is formed by thermoplastic resins such as polystyrene-based, vinyl acetate-based, polyester-based, polyethylene-based, polypropylene-based, polyamide-based, rubber-based, or acrylic-based, and thermosetting resin such as phenol-based, epoxy-based, urethane-based, melamine-based, alkyd-based, etc. Note that the adhesive agent may be any one of the above listed resin or a mixture of them. Further, the adhesive agent may contain an adhesiveness imparting agent. Examples of the adhesiveness imparting agent include tackifier such as aliphatic hydrocarbon resin, C5/C9 mixture resin, rosin, rosin derivative, terpene resin, aromatic series-based hydrocarbon resin, thermal-reactive resin, etc. Further, the conductive filler added to the electroconductive adhesive layer 15 is partially or entirely made of metal material. Examples of the conductive filler include: copper powder, silver powder, nickel powder, silver coated copper powder (Ag coated Cu powder), gold coated copper powder, silver coated nickel powder (Ag coated Ni powder), gold coated nickel powder. These metal powder are produced by atomizing or a carbonyl process. Besides, particles which metal powder coated with resin or particles which resin coated with metal powder are also adoptable. The electroconductive adhesive layer 15 may be added and mixed one or more types of conductive fillers. Note that the conductive filler is preferably Ag coated Cu powder or Ag coated Ni powder. This way, conductive particles with stable electroconductivity are achieved with low-cost material.

In the case of anisotropic electroconductive adhesive layer, the amount of the conductive filler falls within a range of 3 wt % to 39 wt % relative to the whole amount of the electroconductive adhesive layer 15. In the case of isotropic electroconductive adhesive layer, the amount of the conductive filler is more than 39 wt % relative to the whole amount of the electroconductive adhesive layer 15. Further, the average particle diameter of the conductive filler is preferably within a range of 2 µm to 20 µm; however, it could be set to an optimum value according to the thickness of the electroconductive adhesive layer 15. The shape of the metal filler may be any one of the spherical shape, needle-shape, fiber-shape, flake-shape, or dendrite shape.

(Structure of Shield Printed Wiring Board 10)

FIG. 1 is used to describe a shield printed wiring board 10 in which the above-described shield film 1 is pasted onto the FPC (flexible printed wiring board). Although the embodiment represents a case where the shield film is pasted onto an FPC, the present invention is not limited to this. For example, the shield film is also applicable to a COF (Chip-On-Flex), an RF (Rigid Flexible Printed Board), a multiple-layered flexible substrate, a rigid substrate, and the like.

As shown in FIG. 1, the shield printed wiring board 10 has the above-described shield film 1 stacked on a flexible printed wiring board 8. The flexible printed wiring board 8 includes a base film 5, a printed circuit board 6, and an insulating film 7 stacked in this order.

The surface of the printed circuit board 6 has a signal circuit 6a and a ground circuit 6b, and is covered by the insulating film 7 except for at least a part of the ground circuit 6b (insulation removed part 6c). Further, the insulating film 7 has an insulation removed part 7a into which a part of the electroconductive adhesive layer 15 of the shield film 1 flows. Accordingly, the ground circuit 6b and the metal layer 11 are electrically connected to each other.

The wiring patterns of the signal circuit 6a and the ground circuit 6b are formed by etching the conductive material. The ground circuit 6b here means a pattern which maintains the ground potential. In other Words, the base film 5 is provided with a ground circuit 6b which is a wiring pattern for ground.

Note that the wiring pattern formed on the base film 5 may be provided only with the signal circuit 6a. In other words, the ground circuit 6b may not be included in the wiring pattern formed on the base film 5. In this case, the insulation removed part 6c is not formed on the insulating film 7.

The shield printed wiring board 10 includes: a base member (base film 5) having a wiring pattern for signals (signal circuit 6a), and an insulating film 7 covering the wiring pattern for signals. The insulating film 7 is provided on the shield film 1 via the adhesion of the electroconductive adhesive layer 15.

More specifically, the shield printed wiring board 10 includes: a base member (base film 5) having a wiring pattern for signals (signal circuit 6a) and a wiring pattern for ground (ground circuit 6b); and an insulating film 7 provided on the base member in such a manner as to cover the wiring pattern for signals as well as keep at least a part of the wiring pattern for ground uncovered. The insulating film 7 is provided on the shield film 1 via the adhesion of the electroconductive adhesive layer 15.

Note that the base film 5 and the printed circuit board 6 may be bonded by an adhesive agent, or bonded the same way as non-adhesive type copper clad laminate without adhesive agent. Further, the insulating film 7 may be formed by pasting a flexible insulating film through an adhesive agent, or by a series of process including coating, drying, exposure, development, and heating treatment of photosensitive insulative resin. In the case where the insulating film 7 is pasted by using an adhesive agent, the insulation removed part 7a is also formed at the position of the ground circuit 6b of the adhesive agent. Further, the present invention may be exploited as the flexible printed wiring board 8 adopts a single-sided FPC which only one side of the base film is provided with printed circuits, a double-sided FPC which both sides of the base film are provided with printed circuits, a multiple-layered FPC; a Flex Board® having a multiple-layered component mounted part and a cable part; a flex rigid substrate, or a TAB tape for tape carrier packages.

Further, the base film 5 and the insulating film 7 are both made of engineering plastic. Examples of such engineering plastic includes: resin such as polyethylene terephthalate, polypropylene, cross-linked polyethylene, polyester, polybenzimidazole, polyimide, polyimidoamide, polyetherimide, polyphenylene sulphide (PPS). In the case where heat resistance is not required so much, a low-cost polyester film is preferable. In the case where incombustibility is required, a polyphenylene sulphide film is preferable, and in the case where heat resistance is further required, a polyimide film is preferable.

Note that the lower limit of the thickness of the base film 5 is preferably 10 µm, and more preferably 20 µm. Further, the upper limit of the thickness of the base film 5 is preferably 60 µm, and more preferably 40 µm.

Further, the lower limit of the thickness of the insulating film 7 is preferably 10 µm, and more preferably 20 µm. Further, the upper limit of the thickness of the insulating film 7 is preferably 60 µm, and more preferably 40 µm.

As described, in the shield film 1, the electroconductive adhesive layer 15 and the metal layer 11 are provided throughout a surface of the flexible printed wiring board 8 whose ground circuit 6b is partially uncovered. This way, the uncovered part of the ground circuit 6b is electrically connected to the metal layer 11 stacked on the entire electroconductive adhesive layer 15 so that connection to an external ground is possible at any position of the metal layer 11. Further, because the metal layer 11 is provided throughout the surface of the flexible printed wiring board 8, the shielding function may be exerted at any position of the shield film 1.

As the result, the shield film 1 is structured for the area of signal circuit 6a and the area of ground circuit 6b, without dividing the shield film 1 into two areas. Therefore, the limitation to the arrangement of the signal circuit 6a and the ground circuit 6b on the flexible printed wiring board 8 is not restricted so that downsizing and cost reduction become possible.

(Manufacturing Method of Shield Film 1)

The following describes an example manufacturing method of the shield film 1 of the embodiment.

A commercially available copper foil (6 µm) is used for the metal layer 11. To reduce the thickness of the copper foil, etching is preferable. Etching is conducted with a film such as polyethylene terephthalate pasted on the copper foil. Further, the plated layer 12 is formed by plating treatment on one side of the metal layer 11. Then, an electroconductive adhesive agent is applied to the other side of the metal layer 11 to form an electroconductive adhesive layer 15. This way, a shield film 1 is manufactured.

(Manufacturing Method of Shield Printed Wiring Board 10)

First, a laser machining and the like is conducted to form a hole on the insulating film 7 of the flexible printed wiring board 8, thereby forming insulation removed part 7a. This causes some part of the ground circuit 6b at the insulation removed part 7a to be exposed to the outside.

Then, the electroconductive adhesive layer 15 of the shield film 1 is adhered to the insulating film 7 of the flexible printed wiring board 8. During adhesion, the flexible printed wiring board 8 and the shield film 1 are crimped together in the vertical direction by pressing machine, while the shield film 1 is heated through a heater. Accordingly, the electroconductive adhesive layer 15 of the shield film 1 is softened by the heat of the heater, so that it is adhered with the insulating film 7 through the pressure from pressing machine. At this time, the insulation removed part 7a is filled with a part of the softened electroconductive adhesive layer 15. Thus, the part of the ground circuit 6b exposed at the insulation removed part 7a is adhered to the electroconductive adhesive layer 15. As a result, the ground circuit 6b is electrically connected to the metal layer 11 via the electroconductive adhesive layer 15.

Therefore, an embodiment of the present invention is described hereinabove. Note that the present invention is not limited to the above embodiment.

For example, the embodiment shows a case that the shield film 1 is pasted on one side of the shield printed wiring board 10; however, the present invention is not limited to this. For example, the shield film may be pasted on both sides.

The embodiments of the present invention described above solely serve as specific examples of the present invention, and are not limited to the present invention. The specific structures and the like of the present invention are possible to modify by proper design. Further, the effects described in the above embodiments are solely examples of suitable effects brought about by the present invention, and effects of the present invention are not limited to those described hereinabove.

EMBODIMENTS

The following specifically describes the present invention by using Embodiment and Comparative Example of the shield printed wiring board.

The shield printed wiring board 10 with the structure shown in FIG. 1 is adopted as an embodiment. The plated layer of the shield film is a nickel plated layer of 0.1 μm in layer thickness, having 0.03 μm of gold plated layer above. The metal layer of the shield film is rolled copper foil of 6 μm in layer thickness. An anisotropic electroconductive layer of 6 μm in layer thickness is adopted as the electroconductive adhesive layer of the shield film.

Figure 9:
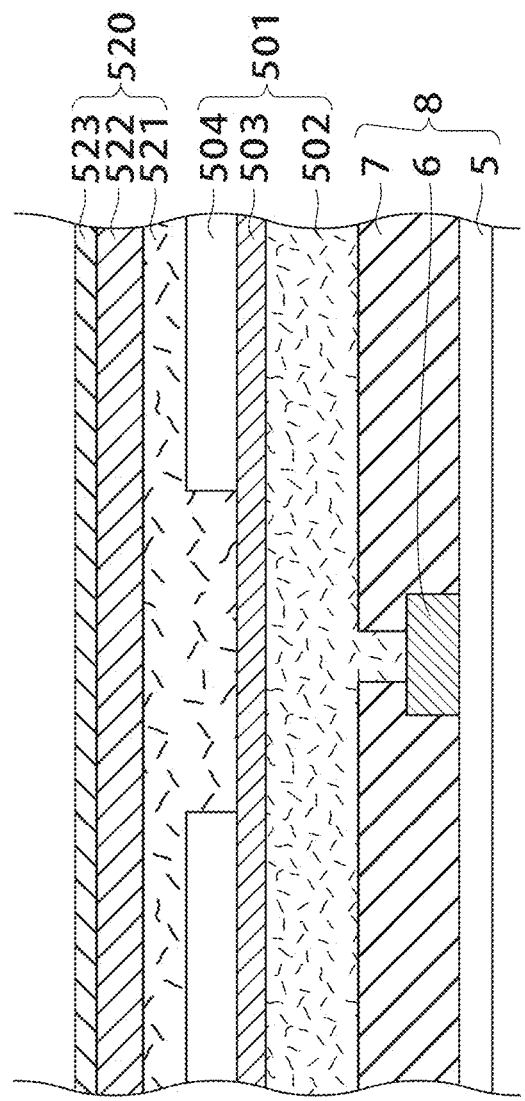
FIG. 9 is a schematic diagram showing a cross section of the shield printed wiring board provided with a traditional shield film used in Comparative Examples.

A traditional shield film, where a ground member is connected to the shield layer, is adopted as a comparative example. As shown in FIG. 9, the shield film 501 of Comparative Example is formed by sequentially stacking: an insulating layer (protective layer) 504 of 5 μm in layer thickness with some part removed; a silver-made metal layer 503 of 0.1 μm in layer thickness; and an electroconductive adhesive layer 502 of 10 μm in layer thickness. Further, the ground member 520 is formed by sequentially stacking: a plated layer 523 formed by forming a gold plated layer of 0.03 μm in layer thickness onto a nickel plated layer of 0.1 μm in layer thickness; a rolled copper foil 522 of 6 μm in layer thickness; and an anisotropic electroconductive adhesive layer 521 of 6 μm in layer thickness.

Further, among the flexible printed wiring board on which the shield film is pasted, each one adopts the structure as shown in FIG. 1. Specifically, The flexible printed wiring board is provided with a 12.5 μm polyimide-made base film 5 having an 18 μm printed circuit 6 formed by a copper wiring pattern for ground and a copper wiring pattern for signals and a 27.5 μm insulating film 7 formed by a 15 μm adhesive layer and a 12.5 μm polyimide-made film layer.

It should be noted that in Comparative Example, the measurement subject was a part where the protective layer 504 is removed and the ground member 520 is attached.

(Resistance Value Characteristics)

Figure 2:
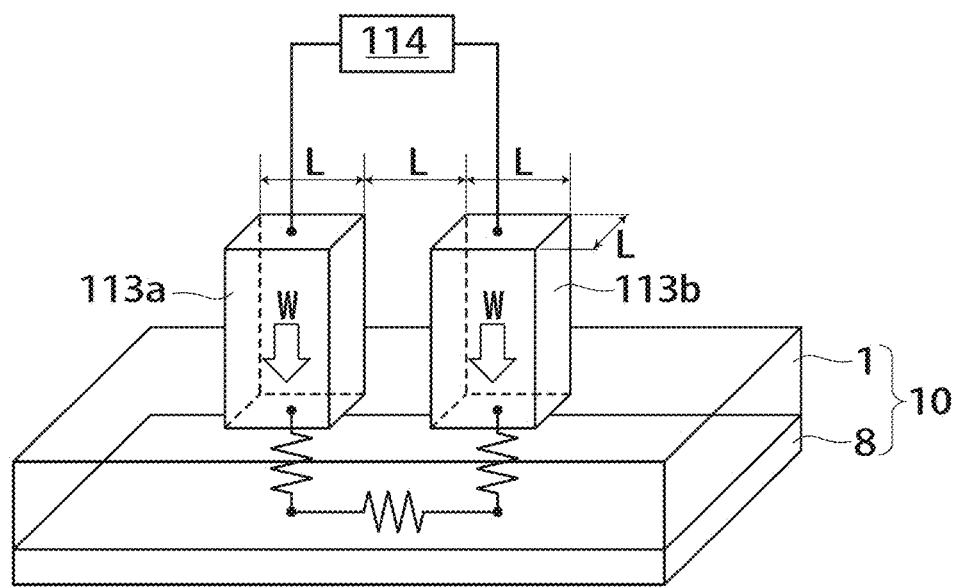
FIG. 2 is a diagram showing a measurement device for resistance value characteristics

First, resistance of the shield film under a constant load conditions was measured. As shown in FIG. 2, two electrode terminals 113a and 113b, serving as electrodes having a load of 1 W (9.8 N) respectively, were disposed on the shield printed wiring board 10. Both electrode terminals 113a and 113b were connected to current input/output terminals of the resistance measurement device 114. Each electrode terminals 113a and 113b is a quadrangular prism with a square bottom surface of L×L mm². Further, the electrode terminals 113a and 113b are spaced from each other by a distance L. In this case, L is approximately 10 mm.

Figure 3:
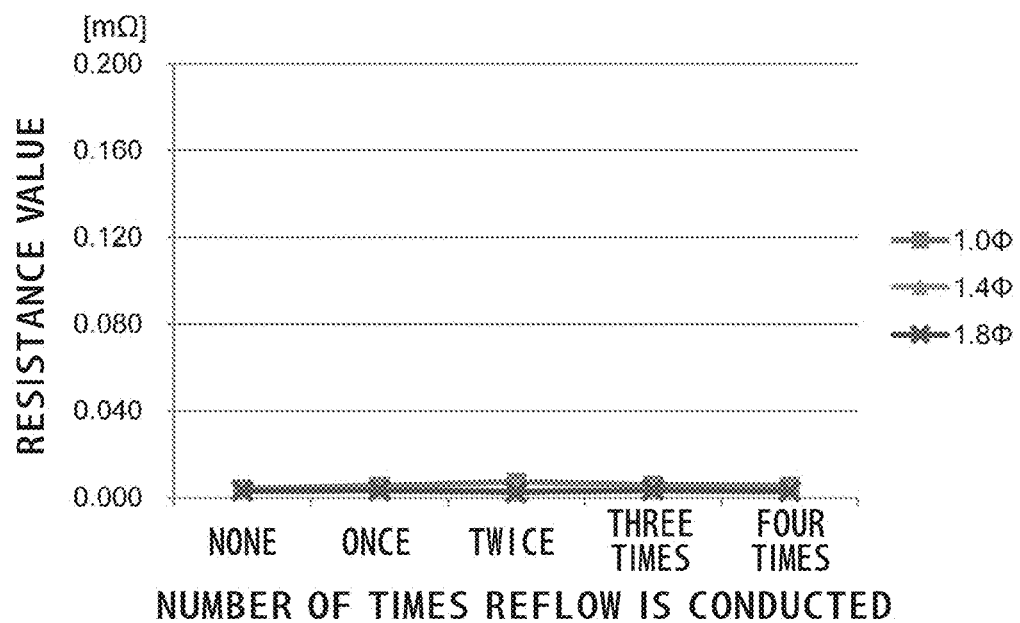
FIG. 3 is a graph showing measurement results of resistance value characteristics in Embodiment.
Figure 4:
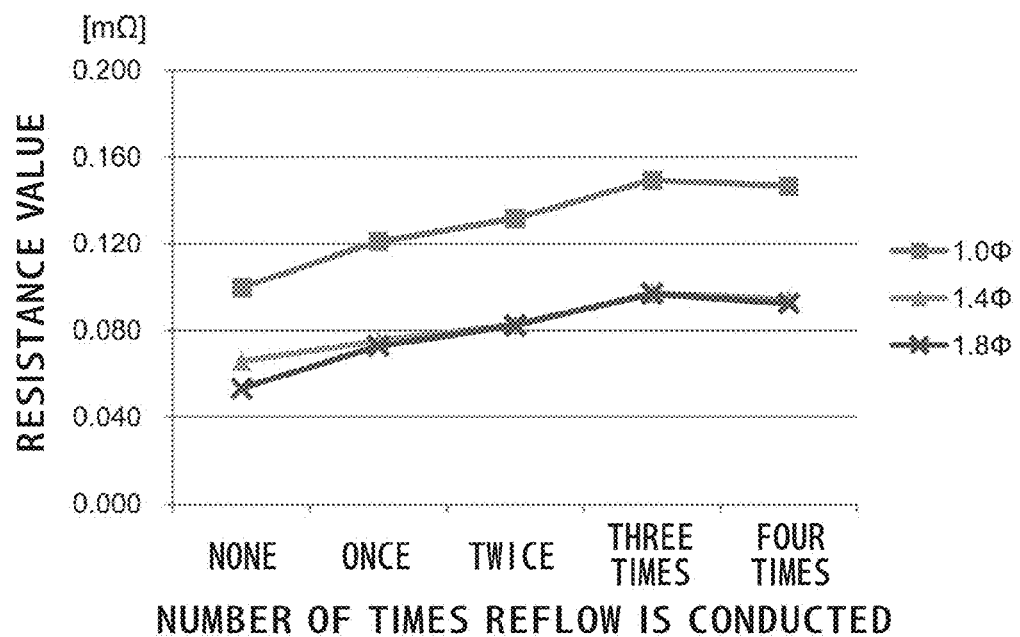
FIG. 4 is a graph indicating results of resistance value characteristics in Comparative Examples.

Variation in the resistance of the shield films of Embodiment and Comparative Example was measured with different number of times reflow conducted for the shield films. The results are shown in FIG. 3 and FIG. 4. The reflow was conducted at 240° C. for 25 seconds each time. FIG. 3 shows the measurement results of Embodiment, and FIG. 4 shows those of Comparative Example. The result shows that the resistance is lower in Embodiment than in Comparative Example, and that Embodiment enables enhancement of grounding to the ground line.

When comparing the shield film 1 of Embodiment (see FIG. 1) with shield film 501 of Comparative Example (see FIG. 9), the number of layers in Comparative Example in which the ground member is stacked is more than that in Embodiment. In other words, in Embodiment, there are less contact points in the direction in which electricity is transmitted. This allows lower resistance.

(Electromagnetic Wave Shielding Characteristics)

Then, a KEC method using an electromagnetic wave shielding effect measurement device 211 (electromagnetic wave shielding effect evaluation device 211a, magnetic wave shielding effect evaluation device 211b) developed by KEC Electronic Industry Development Center was adopted to evaluate the electromagnetic wave shielding characteristics and magnetic wave shielding characteristics of the shield films. FIG. 5 is a diagram showing a configuration of the system used in the KEC method. The system used in the KEC method includes: the electromagnetic wave shielding effect measurement device 211, a spectrum analyzer 221, an attenuator 222 for attenuation of 10 dB, and attenuator 223 for attenuation of 3 dB, and a pre-amplifier 224.

U3741 produced by Advantest Corporation or HP8447F produced by Agilent Technologies was used as the spectrum analyzer 221.

As shown in FIG. 5, the tools (fixtures 213 and 215) for use in measurements of electromagnetic wave shielding characteristics and those of magnetic wave shielding characteristics are different from each other. FIG. 5A shows the electromagnetic wave shielding effect evaluation device 211a. FIG. 5B shows the magnetic wave shielding effect evaluating device 211b.

The electromagnetic wave shielding effect evaluation device 211a are provided with two fixtures 213 facing each other. The shield films 1 (measurement sample) is installed so as to be sandwiched between these fixtures 213. The fixture 213 adopts dimension distribution of TEM Cell (Transverse Electromagnetic Cell), and has a symmetrical structure on the left and right within the surface perpendicular to the axial direction of transmission.

However, to prevent formation of short circuit by insertion of the measurement test piece 1, a planar center conductor 214 is disposed at the gap between each fixture 213.

The magnetic wave shielding effect evaluation device 211b are provided with two fixtures 215 facing each other. Between these fixtures 215, shield films (measurement sample) 1 is installed so as to be sandwiched between these fixtures 215. To generate an electromagnetic field with a large magnetic wave component, the magnetic wave shielding effect evaluation device 211b adopts a shield circular loop antenna 216 for the fixture 215, in combination with a 90 degree metal plate to form a structure that a quarter of the loop antenna is outside.

In the KEC method, signals output from the spectrum analyzer 221 input to the fixture 213 or the fixture 215 on the transmission end via the attenuator 222. Then, the signals are received by the fixture 213 or the fixture 215 on the reception end and amplified by the pre-amplifier 224 via the attenuator 223. Then, the amplified signals level is measured by the spectrum analyzer 221. It should be noted that, with the state of no shield film installed in the electromagnetic wave shielding effect measurement device 211 as the standard, the spectrum analyzer 221 outputs the amount of attenuation while the shield film is installed in the electromagnetic wave shielding effect measurement device 211.

Each of the shield films for use in the measurements in Embodiment and Comparative Example was cut into 15 cm square piece. Regarding Comparative Example, a structure with the above described shield film 501 was only used in Comparative Example 1, and the shield film 501 having thereon the ground member 520 was used in Comparative Example 2. Further, the measurements were conducted within a frequency scope of 1 MHz to 1 GHz. Further, the measurements were conducted in an atmosphere where the temperature was 25° C., and the relative temperature was 30 to 50%.

Figure 6:
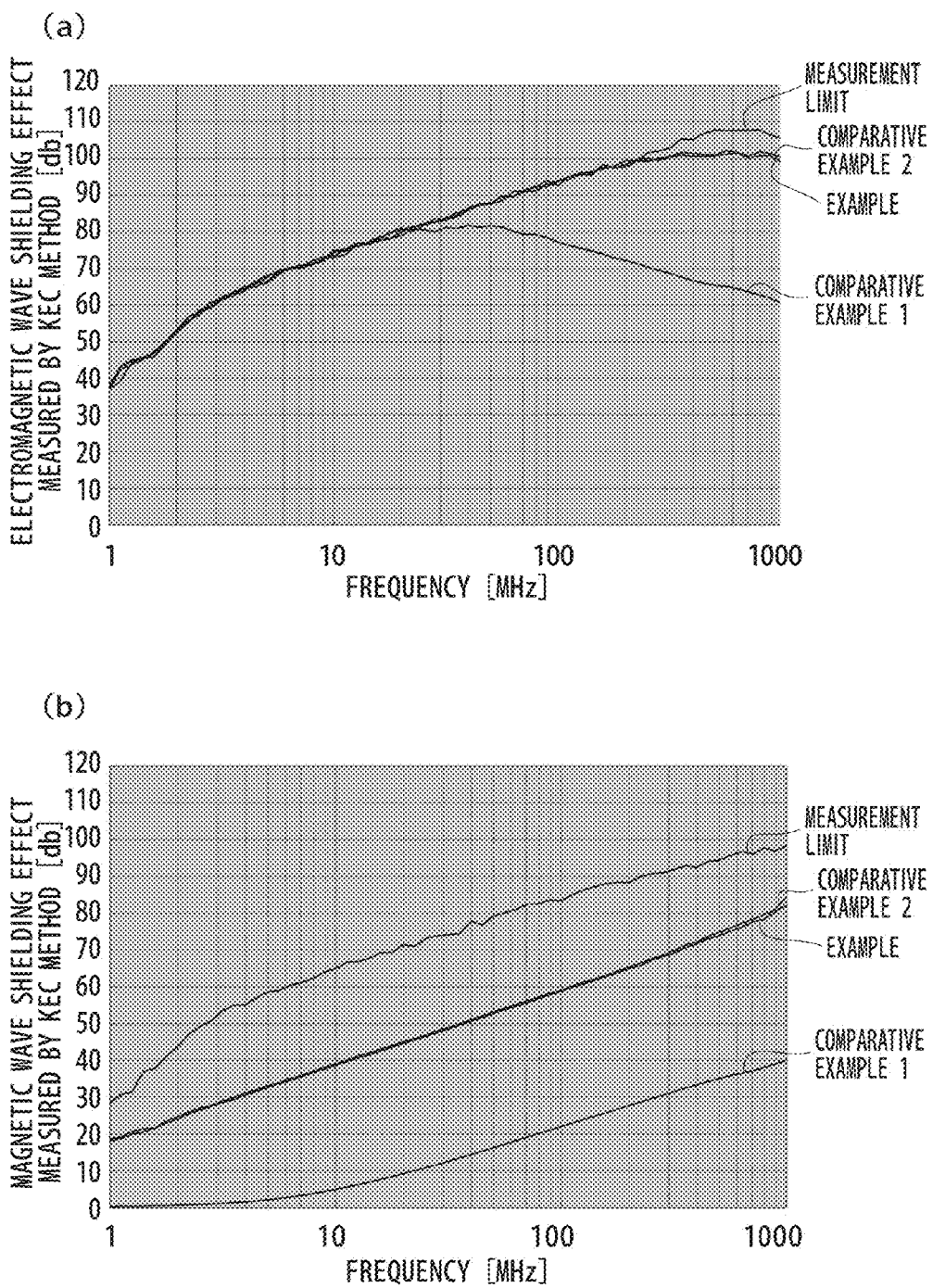
FIG. 6A is a diagram showing measurement results of electromagnetic wave shielding performance by KEC method.
FIG. 6B is a diagram showing measurement results of magnetic wave shielding performance by method.

The measurement result of electromagnetic wave shielding performance by KEC method is shown in FIG. 6A, and the measurement result of magnetic wave shielding performance by KEC method is shown in FIG. 6B. Referring to the figure, it should be understood that attenuated values in either electric field or magnetic field in Embodiment are greater than those in Comparative Example 1 whose structure is only made of shield film. Further, Embodiment achieves similar attenuated values in either electric field or magnetic field as those of Comparative Example 2 whose shield film has the ground member stacked thereon. In other words, Embodiment achieved magnetic wave shielding performance similar to the traditional one, with a simpler and thinner structure.

(Output Waveform Characteristics)

Figure 7:
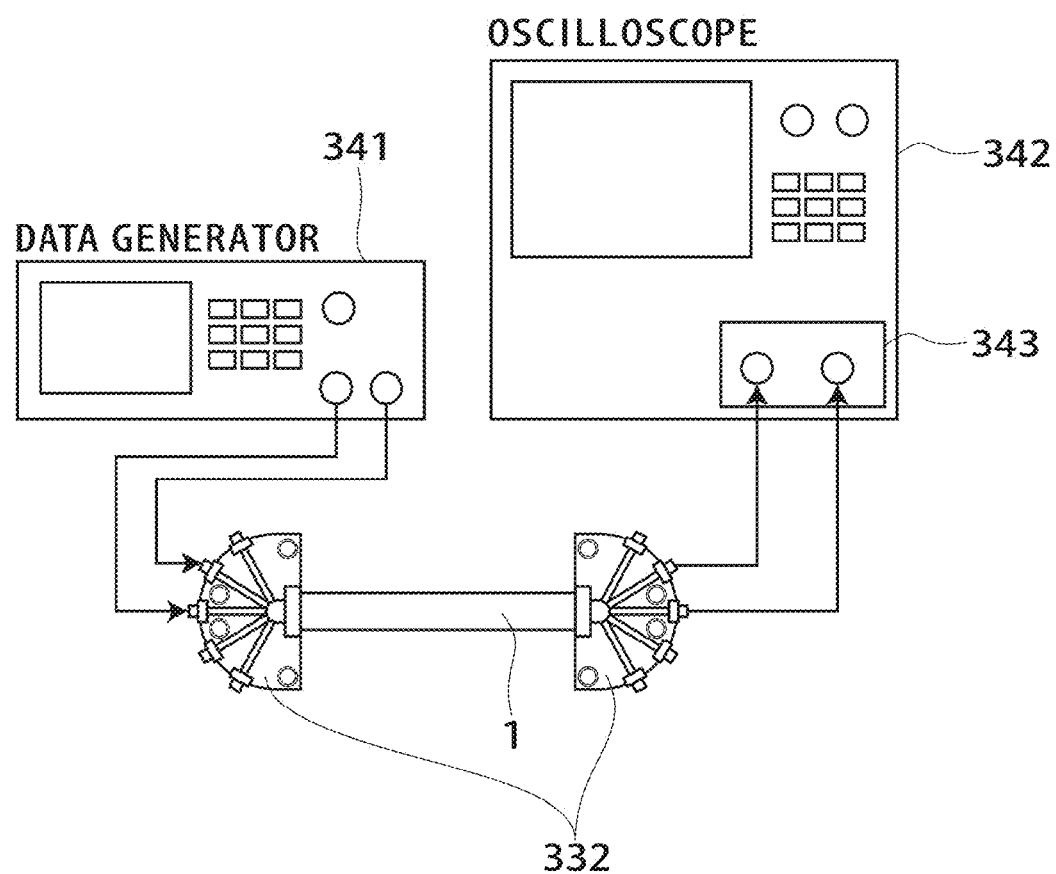
FIG. 7 is a configuration diagram of a system for measurement of signal output waveform characteristics

Next, a system as shown in FIG. 7 is used to evaluate the output waveform characteristics of the shield film. This system includes: a data generator 341, an oscilloscope 342, a sampling module 343 attached to the oscilloscope 342, and a pair of connection substrate 332.

The data generator 341 adopted 81133A produced by Agilent Technologies. The oscilloscope 342 adopted DSC8200 produced by Tektronics, Inc. Further, the sampling module 343 adopted 80E03 produced by Tektronics, Inc.

As shown in FIG. 7, the connection substrate 332 has an input terminal and an output terminal. The shield film 1 as the measurement subject was connected in a manner of a line suspended in the air between a pair of connection substrates 332. Then, the connection substrates 332 were further connected to the data generator 341 and the sampling module 343, and an eye pattern observation was carried out.

The input amplitude was 150 mV/Side (300 mVdiff). Further, the data pattern was PRBS23. Further, the measurements were conducted in an atmosphere where the temperature was 25° C., and the relative temperature was 30 to 50%.

FIG. 8A shows measurement results observed by using oscilloscope 342, in the case of a bit rate of 1.0 Gbps, and FIG. 8B shows measurement results, in the case of a bit rate of 3.0 Gbps. The measurement results show that the eye pattern in Comparative Example were hollower in the middle part than that in Embodiment in either case, despite one-side or two-side shield film. In other words, the shield film in Embodiment is more suitable for high-speed signal processing than that in Comparative Examples 1 and 2.

(Bending Resistance Characteristics)

Next, by comparing with various types of plating, the bending resistance characteristics of the shield film were evaluated. The shield film was provided with a nickel plated layer of at least 0.5 μm, a rolled copper foil layer of at least 18 μm in layer thickness, and a polyimide-made film layer of 12.5 μm in layer thickness. The nickel plated layer used the following two types of layers: a soft nickel plated layer formed in a sulphamic acid bath; and a nickel plated layer formed in a Watts bath. The test sample size was 10 mm×100 mm.

The test for bending resistance was conducted as follows. First, the unfolded test sample of 10 mm×100 mm in the initial state was half folded in longitudinal direction, by a load of 1 Kg. Then, the half folded test sample was again unfolded as in the initial state. This process of folding and unfolding was repeated until a crack occurs at the folded position while the test sample was in unfolded state. Then, the number of times the process repeated until a crack happened was counted.

As the result of the above test for bending resistance, a shield film with the soft nickel plating cracked at the sixth time. On the other hand, the shield film with the nickel plating formed by Watts bath cracked at the third time. Thus, it should be noted that the shield film with the soft nickel plating has a higher resistance to bending, and achieves favorable deformation properties.

REFERENCE NUMERALS

1. Shield Film
5. Base Film
6 Printed Circuit Board
6a. Signal Circuit
6b. Ground Circuit
6c. Insulation Removed Part
7. Insulating Film
7a. Insulation Removed Part
8. Flexible printed wiring board
10. Shield printed wiring board
11. Metal layer
12. Plated Layer
15. Electroconductive Adhesive Layer

The invention claimed is:

1. A shield film to be provided to a printed wiring board, comprising:
   a first, electroconductive adhesive layer which is to be provided throughout and in contact with a surface of a printed-wiring-board insulating film;
   a metal layer provided throughout and in contact with a metal-layer-contacting surface of the first, electroconductive adhesive layer;
   a plated layer provided throughout and in contact with an opposite, plated-layer-contacting surface of the metal layer; and
   a second, black electroconductive adhesive layer provided throughout and in contact with an outer-facing surface of the plated layer, which second, black electroconductive adhesive layer forms an outermost layer of the shield film.

2. The shield film according to claim 1, wherein the metal layer is metal foil whose main component is copper.

3. The shield film according to claim 2, wherein the metal layer is machined so that its layer thickness is from 2 μm to 12 μm.

4. The shield film according to claim 3, wherein the plated layer includes at least one layer made of soft nickel.

5. The shield film according to claim 3, wherein the plated layer includes at least one layer made of soft gold plating.

6. The shield film according to claim 2, wherein the plated layer includes at least one layer made of soft nickel.

7. The shield film according to claim 2, wherein the plated layer includes at least one layer made of soft gold plating.

8. The shield film according to claim 1, wherein the metal layer has been machined so that its layer thickness is from 2 μm to 12 μm.

9. The shield film according to claim 8, wherein the plated layer includes at least one layer made of soft nickel.

10. The shield film according to claim 8, wherein the plated layer includes at least one layer made of soft gold plating.

11. The shield film according to claim 1, wherein the plated layer includes at least one layer made of soft nickel.

12. The shield film according to claim 1, wherein the plated layer includes at least one layer made of soft gold plating.

13. A shield printed wiring board, comprising a printed wiring board having a base member on which a wiring pattern for signals is formed and an insulating film that is provided throughout a surface of the base member so as to cover the wiring pattern for signals, and the shield film according to claim 1 provided to the printed wiring board, with the first, electroconductive adhesive layer of the shield film being provided throughout and in contact with a surface of the printed-wiring-board insulating film.

14. The shield printed wiring board according to claim 13, wherein in the printed wiring board, a wiring pattern for ground is formed on the base member and the insulating film leaves at least a part of the wiring pattern for ground uncovered, and the first, electroconductive adhesive layer is connected with the uncovered part of the wiring pattern for ground.

15. The shield printed wiring board according to claim 13, wherein the metal layer has been machined so that its layer thickness is from 2 μm to 12 μm.

16. The shield printed wiring board according to claim 13, wherein the metal layer is metal foil whose main component is copper.

* * * * *